United States Patent
Kusko et al.

(10) Patent No.: US 10,613,142 B2
(45) Date of Patent: Apr. 7, 2020

(54) NON-DESTRUCTIVE RECIRCULATION TEST SUPPORT FOR INTEGRATED CIRCUITS

(71) Applicant: International Business Machines Corporation, Armonk, NY (US)

(72) Inventors: Mary P. Kusko, Hopewell Junction, NY (US); Franco Motika, Hopewell Junction, NY (US); Gerard M. Salem, Essex Junction, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 413 days.

(21) Appl. No.: 15/439,176

(22) Filed: Feb. 22, 2017

(65) Prior Publication Data

US 2018/0238964 A1    Aug. 23, 2018

(51) Int. Cl.
*G01R 31/317*   (2006.01)
*G01R 31/3181*  (2006.01)
*G01R 31/34*    (2020.01)

(52) U.S. Cl.
CPC ... *G01R 31/31723* (2013.01); *G01R 31/3181* (2013.01); *G01R 31/3172* (2013.01)

(58) Field of Classification Search
CPC .......... G01R 31/31723; G01R 31/3181; G01R 31/3172; G01R 31/318541;

(Continued)

(56) References Cited

U.S. PATENT DOCUMENTS 3,761,695 A   9/1973   Eichelberger
3,784,907 A   1/1974   Eichelberger
(Continued)

FOREIGN PATENT DOCUMENTS

EP    0556826 A2    8/1993
JP    2005233957    9/2005
(Continued)

OTHER PUBLICATIONS

Kusko et al., "Functional Diagnostics Based on Dynamic Selection of Alternate Clocking"; U.S. Appl. No. 15/805,586, filed Nov. 7, 2017.

(Continued)

*Primary Examiner* — April Y Blair
*Assistant Examiner* — Dipakkumar B Gandhi
(74) *Attorney, Agent, or Firm* — Cantor Colburn LLP; Margaret McNamara (57) ABSTRACT

Providing non-destructive recirculation test support in a device under test includes determining an initial latch allocation of a plurality of latches to form a plurality of self-test chains for the device under test. An optimized latch allocation to the self-test chains is determined based on a plurality of physical and logical grouping constraints. One or more of the latches are adjusted and reassigned between one or more of the self-test chains based on the optimized latch allocation. A recirculating feedback is coupled from an output of at least one of the self-test chains to a recirculation selector. A test input source is coupled to the recirculation selector, where the recirculation selector is operable to select between providing the test input source or the recirculating feedback to an input of the at least one of the self-test chains.

18 Claims, 7 Drawing Sheets

(58) Field of Classification Search
CPC .... G01R 31/318544; G01R 31/318533; G01R 31/318597
See application file for complete search history.

(56) References Cited

U.S. PATENT DOCUMENTS

| | | | |
|---|---|---|---|
| 4,503,537 A | | 3/1985 | McAnney |
| 4,513,418 A | | 4/1985 | Bardell, Jr. et al. |
| 4,688,222 A | | 8/1987 | Blum |
| 5,136,590 A | | 8/1992 | Polstra et al. |
| 5,369,648 A | | 11/1994 | Nelson |
| 5,442,642 A | * | 8/1995 | Ingalls ........... G01R 31/318505 714/718 |
| 5,694,402 A | | 12/1997 | Butler et al. |
| 5,784,383 A | | 7/1998 | Meaney |
| 5,983,380 A | | 11/1999 | Motika et al. |
| 6,018,815 A | | 1/2000 | Baeg |
| 6,311,311 B1 | | 10/2001 | Swaney et al. |
| 6,327,685 B1 | | 12/2001 | Koprowski et al. |
| 6,442,723 B1 | | 8/2002 | Koprowski et al. |
| 6,463,560 B1 | | 10/2002 | Bhawmik et al. |
| 6,484,280 B1 | | 11/2002 | Moberly |
| 6,516,432 B1 | | 2/2003 | Motika et al. |
| 6,636,997 B1 | | 10/2003 | Wong et al. |
| 6,658,617 B1 | | 12/2003 | Wong |
| 6,807,645 B2 | | 10/2004 | Angelotti et al. |
| 6,807,646 B1 | | 10/2004 | Williams et al. |
| 6,836,866 B2 | | 12/2004 | Nolles et al. |
| 6,961,886 B2 | | 11/2005 | Motika et al. |
| 7,017,095 B2 | | 3/2006 | Forlenza et al. |
| 7,191,373 B2 | | 3/2007 | Wang et al. |
| 7,363,560 B1 | | 4/2008 | Mark et al. |
| 7,376,875 B2 | | 5/2008 | Hilgendorf et al. |
| 7,546,504 B2 | | 6/2009 | Riley et al. |
| 7,574,644 B2 | | 8/2009 | Forlenza et al. |
| 7,657,764 B2 | | 2/2010 | Jorgenson et al. |
| 7,793,184 B2 | | 9/2010 | Douskey |
| 7,840,861 B2 | | 11/2010 | Sul |
| 8,122,312 B2 | | 2/2012 | Floyd et al. |
| 8,230,283 B2 | | 7/2012 | Gillis et al. |
| 8,843,797 B2 | | 9/2014 | Motika et al. |
| 9,057,766 B2 | | 6/2015 | Al-Omari et al. |
| 9,292,398 B2 | | 3/2016 | Cook et al. |
| 9,297,855 B1 | | 3/2016 | Jindal et al. |
| 9,448,282 B1 | | 9/2016 | Meehl |
| 2002/0046377 A1 | | 4/2002 | Kniffler et al. |
| 2003/0149925 A1 | * | 8/2003 | Angelotti ......... G01R 31/31813 714/726 |
| 2003/0204802 A1 | * | 10/2003 | Sim .................... G01R 31/2891 714/726 |
| 2004/0004482 A1 | | 1/2004 | Bouabdo et al. |
| 2004/0230882 A1 | | 11/2004 | Huott et al. |
| 2005/0091622 A1 | * | 4/2005 | Pappu ........... G01R 31/318591 716/102 |
| 2005/0097418 A1 | | 5/2005 | Anzou et al. |
| 2006/0200719 A1 | | 9/2006 | Keller |
| 2007/0139075 A1 | * | 6/2007 | Goel ................ G01R 31/31922 326/46 |
| 2007/0234157 A1 | * | 10/2007 | Rajski ........... G01R 31/318547 714/728 |
| 2008/0320347 A1 | | 12/2008 | Cussonneau et al. |
| 2009/0178014 A1 | * | 7/2009 | Fredrickson ........ G06F 17/5072 716/132 |
| 2012/0159273 A1 | | 6/2012 | Douskey et al. |
| 2012/0324303 A1 | * | 12/2012 | Tekumalla ..... G01R 31/318563 714/729 |
| 2014/0122949 A1 | * | 5/2014 | Elkin ............. G01R 31/318541 714/726 |
| 2016/0033571 A1 | | 2/2016 | Forlenza et al. |
| 2016/0178696 A1 | | 6/2016 | Bhamidipati et al. |
| 2016/0349318 A1 | | 12/2016 | Pereira et al. |

FOREIGN PATENT DOCUMENTS

| | | |
|---|---|---|
| JP | 2008249481 A | 10/2008 |
| JP | 2013088400 A | 5/2013 |

OTHER PUBLICATIONS

List of IBM Patents or Patent Applications Treated as Related, Jan. 12, 2018, 2 pages.
B. Konemann, et al., "Built-In Test for Complex Digital Integrated Circuits," IEEE Journal of Solid State Circuits, vol. SC-15, pp. 315-318, Jun. 1980, 2 pages.
E. Eichelberger, et al., "A Logic Design Structure for LSI Testability," Proceedings of the 14th Design Automation Conf., New Orleans, Jun. 1977, 7 pages.
He et al., "Test-Point Insertion Efficiency Analysis for LBIST Applications," Apr. 2016 IEEE 34th VLSI Test Symposium (VTS), 6 pages.
ip.com et al., "High Speed Test Time Scan Chain Diagnostics Using LBIST STUMPS Segmented Patterns and High Speed Digital Capture Memory," Aug. 6, 2012, 6 pages.
ip.com et al., "Method of Diagnosing Intermittent Logic Built-In Self Test Pattern Sequence Dependencies," Sep. 15, 2004, 5 pages.
List of IBM Patents or Patent Applications Treated as Related, Apr. 7, 2017, 2 pages.
R. Kapur, et al., "New Approach Moves logic BIST Into Mainstream," EEdesign, Oct. 14, 2002, 4 pages.
U.S. Appl. No. 15/439,161, filed Feb. 22, 2017, Entitled: Structurally Assisted Functional Test and Diagnostics for Integrated Circuits, First Named Inventor: Mary P. Kusko.
List of IBM Patents or Patent Applications Treated as Related, Oct. 3, 2017, 2 pages.
U.S. Appl. No. 15/718,271, filed Sep. 28, 2017, Entitled: Functional Diagnostics Based on Dynamic Selection of Alternate Clocking, First Named Inventor: Mary P. Kusko.
P. Song, et al., S/390 G5 CMOS microprocessory diagnostics, IBM J. Res. Develop., vol. 43 No. 5/6 Sep./Nov. 1999, 16 Pages.
Parvathala et al.; "FRITS—A Microprocessor Functional BIST Method"; ITC International Test Conference; 2002 IEEE; 9 pages.
Rodriguez-Irago et al.; "Dynamic Fault Test and Diagnosis in Digital Systems Using Multiple Clock Schemes and Multi-VDD Test"; 11th IEEE International On-Line Testing Symposium; 2005; 6 pages.
Song et al.; "Diagnostic Techniques for the IBM S/390 600 MHz G5 Microprocessor"; IEEE Xplore Conference Paper; Feb. 1999; 11 pages.

* cited by examiner

NON-DESTRUCTIVE RECIRCULATION TEST SUPPORT FOR INTEGRATED CIRCUITS

BACKGROUND

Aspects are related generally to integrated circuit testing, and more specifically to non-destructive recirculation test support for integrated circuits.

When developing integrated circuit systems, resulting devices need to be tested and faults diagnosed. A common diagnostic approach in industry uses post-test software algorithms that run on fail data collected at a test system. To generate the data, patterns can be applied to a device under test and the responses collected. Failing responses can be fed into design automation software which analyzes the fail data and gives suspected callouts for the defect detected. A set of faults is associated with each design. A typical fault model is the "stuck-at" fault model, which includes both a stuck-at-1 and stuck-at-0 fault. The design is typically a gate-level representation (AND, OR, XOR, etc.), and the faults are applied at the inputs and outputs of each logic block. Based on a complete list of faults, diagnostic software typically produces a callout identifying the most likely faults to explain the faulty response. The goal is to have a precise enough callout so that physical failure analysis can be done on the device under test to identify the physical defect and determine the root cause.

Generally, there are two types of diagnostic techniques: cause-effect analysis techniques and effect-cause analysis techniques. Cause-effect techniques depend on stored symptoms caused by possible faults and use the observed responses to locate the fault. A fault dictionary approach is one such example. Problems with this approach, especially for large chips, can include excessively long simulation run time with prohibitively large memory requirements and ineffective physical and electrical failure analysis due to low diagnostic resolution. In contrast, effect-cause techniques do not depend on pre-stored data but instead process the response obtained from the device under test to determine the possible faults that generate the response. Effect-cause algorithms are less processing resource intensive and are well suited to fault diagnostics. Software diagnostic techniques are typically faster than other methods; however, fault candidates can be wrong or there can be too many candidates with low scores. A fault with a low score is one with a low probability of explaining the failure. This can result from incomplete fail data, un-modeled fault types such as path delay and bridging faults, and faults in areas of logic that are not fully represented in the fault model (such as clock logic).

To support built-in testing of logic circuits, some integrated circuit designs use a combination of scan channel chains of various lengths feeding into individual test register inputs that are processed in parallel. The test registers and scan channel chains typically operate by continually shifting values through the scan channel chains and test registers which results in destructive read/unload operations and makes it difficult to restore the test configuration to an intermediate state. All of these test techniques have resulted in a need for better, improved test support systems and methods.

SUMMARY

According to one embodiment, a method of providing non-destructive recirculation test support in a device under test includes determining an initial latch allocation of a plurality of latches to form a plurality of self-test chains for the device under test. An optimized latch allocation to the self-test chains is determined based on a plurality of physical and logical grouping constraints. One or more of the latches are adjusted and reassigned between one or more of the self-test chains based on the optimized latch allocation. A recirculating feedback is coupled from an output of at least one of the self-test chains to a recirculation selector. A test input source is coupled to the recirculation selector, where the recirculation selector is operable to select between providing the test input source or the recirculating feedback to an input of the at least one of the self-test chains.

According to a further embodiment, a system includes a device under test and a test and development system. The device under test includes a plurality of latches and one or more built-in test support circuits. The test and development system includes a processor operable determine an initial latch allocation of the plurality of latches to form a plurality of self-test chains for the device under test and determine an optimized latch allocation to the self-test chains based on a plurality of physical and logical grouping constraints. The processor is further operable to adjust and reassign one or more of the latches between one or more of the self-test chains based on the optimized latch allocation. A recirculating feedback from an output of at least one of the self-test chains is coupled to a recirculation selector of the one or more built-in test support circuits. A test input source is coupled to the recirculation selector, where the recirculation selector is operable to select between providing the test input source or the recirculating feedback to an input of the at least one of the self-test chains.

According to another embodiment, a computer program product for providing non-destructive recirculation test support in a device under test is provided. The computer program product includes a computer readable storage medium having program instructions embodied therewith, where the computer readable storage medium is not a transitory signal per se. The program instructions are executable by a processor to cause the processor to perform a method that includes determining an initial latch allocation of a plurality of latches to form a plurality of self-test chains for the device under test and determining an optimized latch allocation to the self-test chains based on a plurality of physical and logical grouping constraints. The program instructions executable by the processor further cause the processor to adjust and reassign one or more of the latches between one or more of the self-test chains based on the optimized latch allocation. The program instructions executable by the processor further cause the processor to couple a recirculating feedback from an output of at least one of the self-test chains to a recirculation selector and couple a test input source to the recirculation selector, where the recirculation selector is operable to select between providing the test input source or the recirculating feedback to an input of the at least one of the self-test chains.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter is particularly pointed out and distinctly claimed in the claims at the conclusion of the specification. The forgoing and other features, and advantages of the embodiments herein are apparent from the following detailed description taken in conjunction with the accompanying drawings in which:

DETAILED DESCRIPTION

Embodiments are directed to providing non-destructive recirculation test support in a device under test. Embodiments can be used to support both structural and/or functional testing in the device under test. Structural testing typically verifies that proper connections are made between low-level logic blocks without concern for higher-level functional aspects that may be involved in actual execution of instruction sequences. Embodiments control the assignment of latches within the device under test to self-test chains to a balanced and scaled chain size with circulating feedback. A recirculating selector can be configured to pass either a test source input or the circulating feedback through one or more self-test chains to enable direct flow-through testing and non-destructive recirculation. Embodiments can use structural design for test (DFT) and logic built-in self-test (LBIST) of on-chip test support systems with diagnostics such as selective signature generation. The testing and diagnostics can be performed at the chip level and expanded to support higher level package and system test.

Embodiments enable a structural test methodology optionally to be used in conjunction with a functional test diagnostic methodology, thereby facilitating testing of large integrated functional designs. Recirculation support can enable functional exercisers or tests to be performed up to one or more checkpoints (also referred to as breakpoints), and then structural DFT and built-in diagnostic support can be used to isolate the cause of a failure. The diagnostic process can be iteratively invoked for multiple checkpoints by restarting and continuing the functional execution sequence to the next checkpoint.

Figure 1:
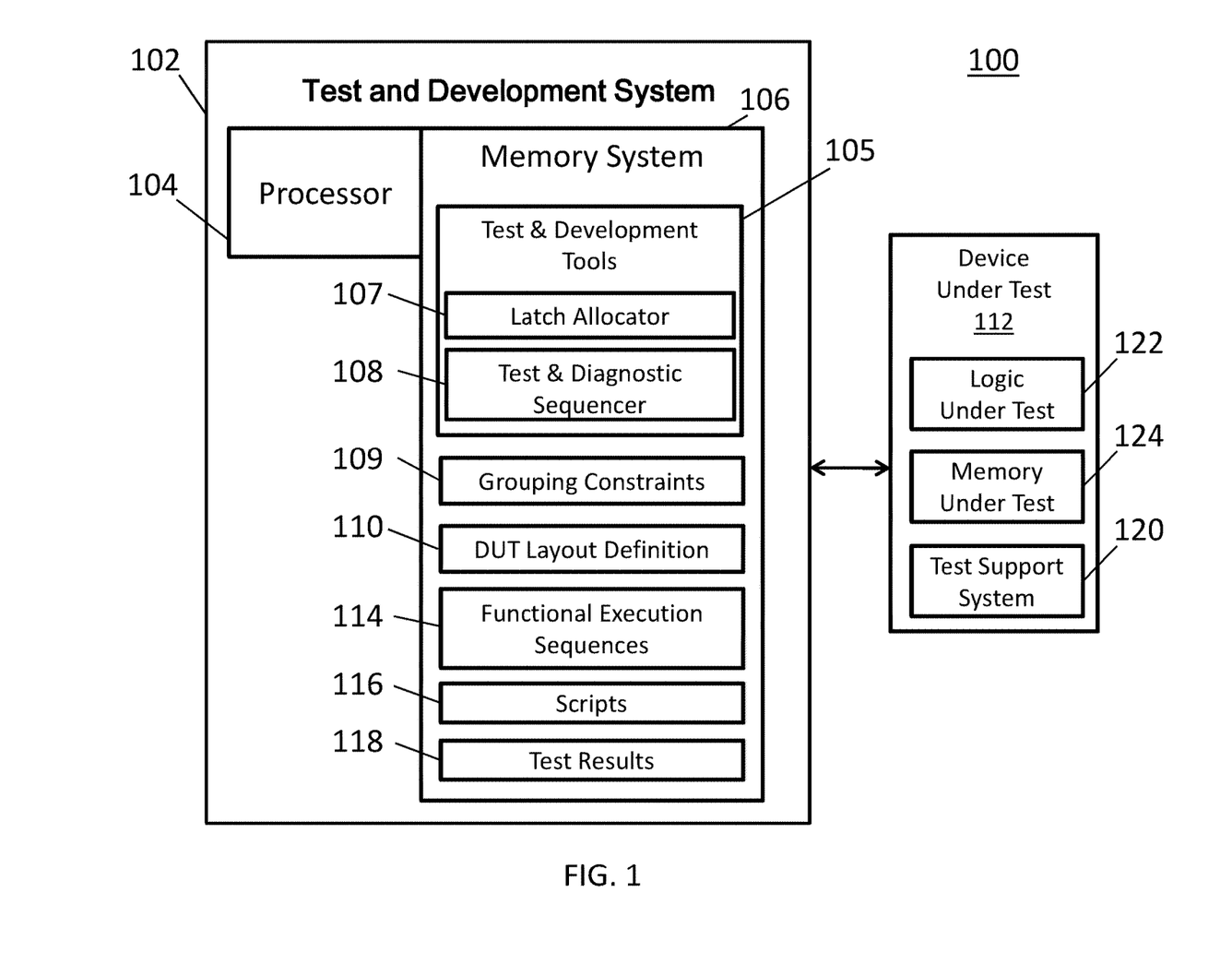
FIG. 1 illustrates a system in accordance with an embodiment.

Turning now to FIG. 1, a system 100 is generally shown that includes a test and development system 102 that may be used as part of an integrated circuit (IC) development system configured to incorporate an integrated circuit layout into a device under test (DUT) 112 and verify/troubleshoot operation of the DUT 112. For example, the DUT 112 may be fabricated as an IC chip based on design files generated and/or modified by the test and development system 102. The test and development system 102 can also support identification of failures in the DUT 112 and may identify one or more likely causes of failures in the DUT 112. The DUT 112 can be distributed by the fabricator in raw wafer form (that is, as a single wafer that has multiple unpackaged chips), as a bare die, or in a packaged form. In the latter case the DUT 112 can be mounted in a single chip package (such as a plastic carrier, with leads that are affixed to a motherboard or other higher level carrier) or in a multichip package (such as a ceramic carrier that has either or both surface interconnections or buried interconnections). The DUT 112 may also be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Continuing with the description of FIG. 1, the test and development system 102 includes a processor 104 and a memory system 106. The processor 104 can be any type of processing circuitry and/or microcontroller, including multiple instances thereof, that is configurable to execute processes further described herein, where the memory system 106 is an example of a tangible storage medium. The memory system 106 can include test and development tools 105, such as a latch allocator 107 and a test and diagnostic sequencer 108. The memory system 106 can also include grouping constraints 109, a DUT layout definition 110, one or more functional execution sequences 114, scripts 116, and/or test results 118. In an exemplary embodiment, the processor 104 is coupled to the memory system 106, and the processor 104 is configured to execute the latch allocator 107 to apply grouping constraints 109 to adjust the DUT layout definition 110 for assigning particular latches in logic under test 122 of the DUT 112 to channels/chains of a test support system 120 of the DUT 112.

The test and diagnostic sequencer 108 can be executed by the processor 104 to perform one or more portions of the functional execution sequences 114 on the test support system 120 of the DUT 112 to verify operation and diagnose a cause of one or more failure of the logic under test 122 and/or memory under test 124 of the DUT 112. In some embodiments, the scripts 116 can be used to select portions of the functional execution sequences 114 to run and to support a searching process to isolate the cause of a failure in combination with the DUT layout definition 110. Failure information can be captured in the test results 118 to indicate a likely failure cause in the DUT 112 as referenced against the DUT layout definition 110.

The logic under test 122 in the DUT 112 can include various logic circuits with latches and logic blocks (e.g., logic gates) organized to implement a particular function, such as an arithmetic logic unit, a decoding unit, an instruction fetch unit, and other such functional blocks that may be present in a processor or other type of integrated circuit. The memory under test 124 can be within the DUT 112 and/or otherwise accessible by the DUT 112, such as internal memory, cache memory, main memory, and the like. The test support system 120 in the DUT 112 can include one or more self-test chains for LBIST and one or more signature registers to capture and verify the functional state of the DUT 112. For example, the functional execution sequences 114 can include a sequence of instructions that invoke a sequence of operations on either or both of the logic under test 122 and/or the memory under test 124. Failures may not be readily identified immediately upon occurrence but may be identified after a sequence of multiple operations are performed as values flow through self-test chains and results are captured in one or more signature registers of the test support system 120. Embodiments can use a sequence of checkpoints and selectively re-execute different sized portions of the functional execution sequences 114 in combination with applying one or more built-in test support circuits of the DUT 112 to identify one or more likely causes of a failure identified at one or more checkpoints as further described herein.

Figure 2:
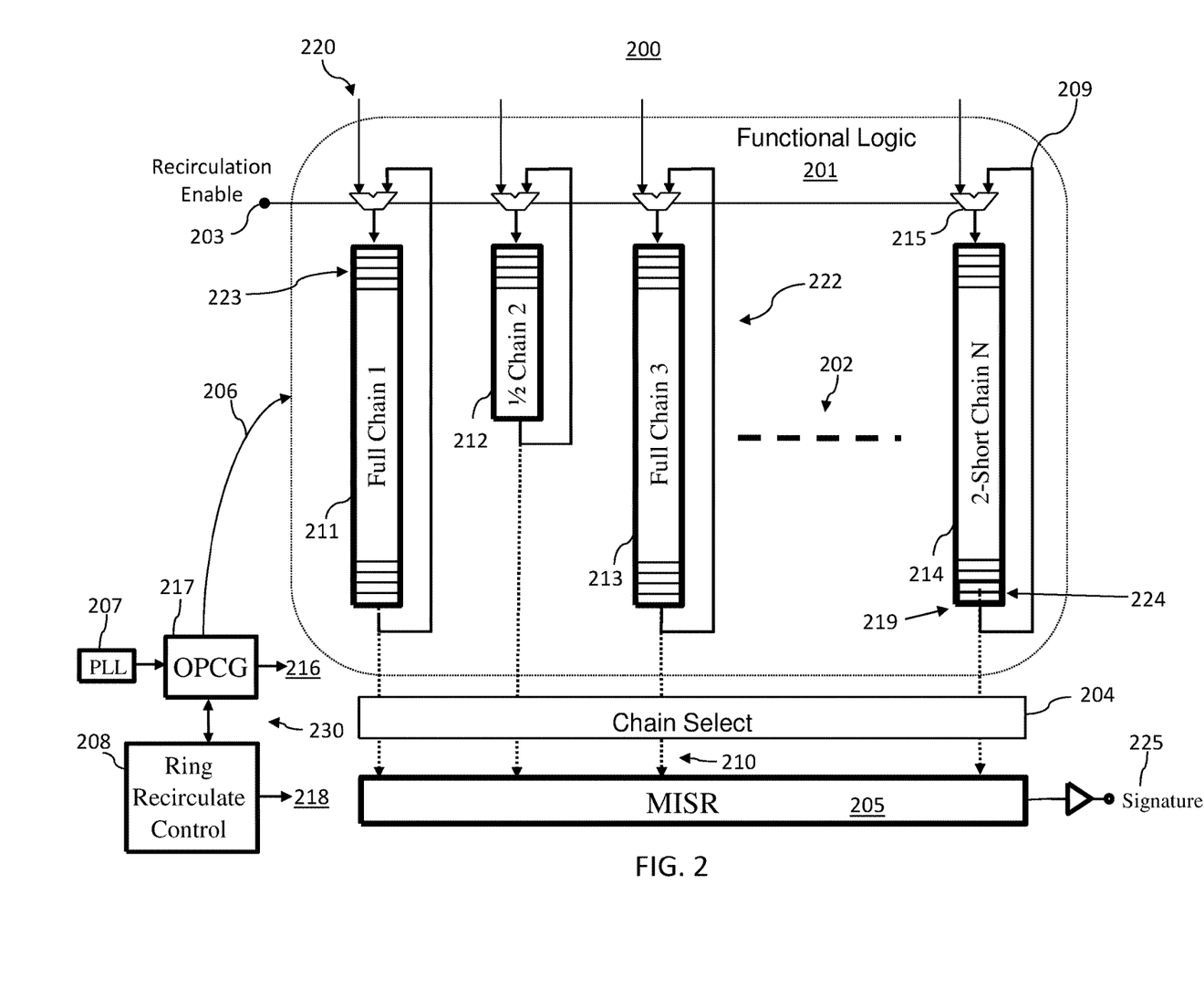
FIG. 2 illustrates an example of a test support system in a device under test in accordance with an embodiment.

FIG. 2 illustrates an example of a test support system 200 as an embodiment of the test support system 120 of FIG. 1. The test support system 200 includes functional logic 201 that controls the flow of test data from a test input source 220 through a plurality of built-in test support circuits 202 including self-test chains 222. The self-test chains 222 form portions of a plurality of individual self-test using MISR and parallel shift register sequence generators (STUMP) channels, where a MISR is a multiple input signature register, such as MISR 205. In the example of FIG. 2, the self-test chains 222 are depicted as a half chain 212 (half of maximum length chain), two full chains 211, 213 (maximum length chains), and a 2-short chain 214 (maximum length chain minus two, which may include latch padding 224 to balance recirculating scan chain length, for instance). The self-test chains 222 can be formed from storage elements, such as latches 223 or registers, of the logic under test 122 of FIG. 1.

When in LBIST mode of operation, the storage elements can be concatenated in one or more self-test chains 222, which may be externally and individually accessible via one or more serial inputs and outputs. The self-test chains 222 can be loaded and unloaded serially for each LBIST test. Once in LBIST mode, one or more scan chains of storage elements can be reconfigured into a number of parallel sub-chains as the self-test chains 222 including chains 211, 212, 213, 214. During structural testing, pseudo-random data can be loaded in parallel into each of the self-test chains 222 as supplied by a linear feedback shift register (LFSR) (not depicted) as test input source 220, for example, and used as test stimuli. During functional testing, inputs (e.g., test input source 220) to the self-test chains 222 are based on instruction sequencing and/or memory operations with respect to the logic under test 122 and/or the memory under test 124 when performing functional execution sequences 114 of FIG. 1. Similarly, the state of all latches in the self-test chains 222 can be unloaded serially through chain select 204 as STUMP channel scan output 210 into the MISR 205 forming a signature 225 representing compressed data results.

Each LBIST test cycle, in addition to the loading and unloading of the self-test chains 222, uses timed application of system clocks to launch a test vector through self-test chains 222 and capture a resulting response in receiving latches. A typical system design may include several system clocks and various path delays; therefore, a clock test sequence and timing setup may be applied multiple times with different clock combinations and timings. Test timing can be controlled by phase locked loop 207 and an on-product clock generation (OPCG) function 217 to produce scan clocks 206 for structural and functional exercising of the functional logic 201 and MISR controls and clocks 216 for MISR 205.

An LBIST test interval can include a relatively large number of load/unload sequences followed by the system clock cycle. At the end of the interval, the MISR 205 contents or signature 225 can be unloaded and compared to an expected signature. Several signature intervals may be applied to achieve the desired test coverage.

The example of FIG. 2 also depicts a multiple ring configuration with recirculating feedback in the functional logic 201 through one or more recirculating feedbacks 209 from output 219 of the self-test chains 222. Recirculation capability can be provided for each of the self-test chains 222. One or more recirculating mode enable signals 203 (i.e., a shared recirculation enable signal or multiple separate recirculation enable signals) can be used to determine whether each of the self-test chains 222 is operating as a scan chain or in a recirculating mode through recirculation selectors 215. A ring recirculate control 208 can interface with the OPCG 217 for recirculating scan control channel selection 218 and to provide controls for the MISR 205 in recirculating operation. The OPCG 217 and/or the ring recirculate control 208 are examples of one or more functional test exercisers 230 that can support execution of the functional execution sequences 114 of FIG. 1. After a ring dump to the MISR 205, a functional test can be restarted to progressively isolate a failure source. Recirculation can support the ability to restart the functional execution sequences 114 of FIG. 1 at a checkpoint position rather than restarting at the beginning of an execution sequence to speed the process of progressively isolating one or more likely causes of a failure as a most likely failure source. The process of allocating particular latches 223 to particular self-test chains 222 and chain sizing can be performed as further described herein in reference to FIGS. 5 and 6.

Figure 3:
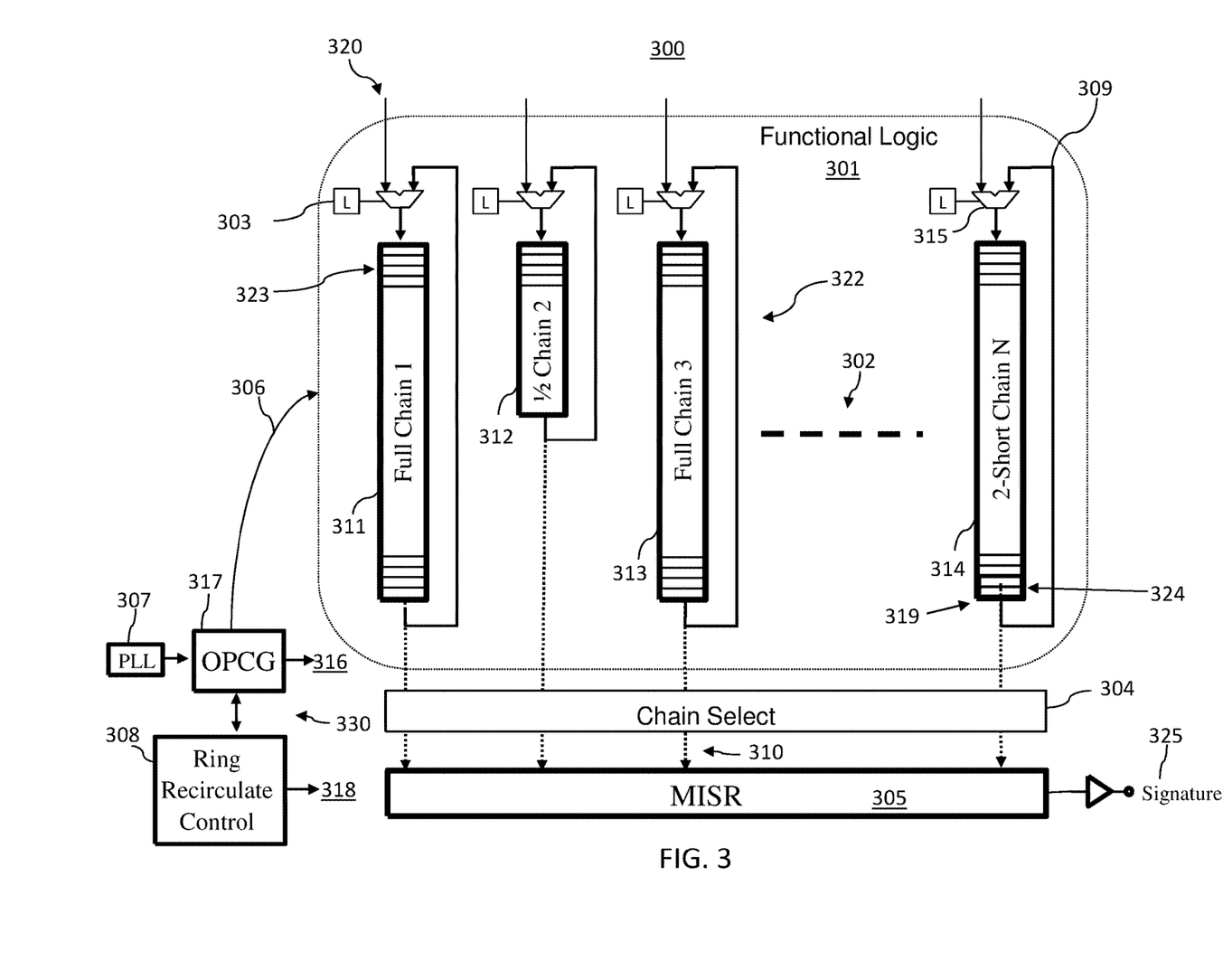
FIG. 3 illustrates another example of a test support system in a device under test in accordance with an embodiment.

FIG. 3 illustrates another example of a test support system 300 in a device under test in accordance with an embodiment, such as the test support system 120 of DUT 112 of FIG. 1. The test support system 300 includes functional logic 301 that controls the flow of test data from a test input source 320 through a plurality of built-in test support circuits 302 including self-test chains 322. The self-test chains 322 can include a plurality of STUMP/self-test chains 311, 312, 313, 314 of various lengths. The self-test chains 322 can be formed from storage elements, such as latches 323 or registers, of the logic under test 122 of FIG. 1. When in LBIST mode of operation, the storage elements can be concatenated in one or more self-test chains 322, which may be externally accessible via one or more serial inputs and outputs. One or more of the self-test chains 322 can be loaded and unloaded serially for each LBIST test. Once in LBIST mode, one or more scan chains of storage elements can be reconfigured into a number of parallel sub-chains as the self-test chains 322 including chains 311, 312, 313, 314.

During functional testing, inputs (e.g., test input source 320 or functional stimuli clocked broadly into the latches via the latch system ports) to the self-test chains 322 are based on instruction sequencing and/or memory operations with respect to the logic under test 122 and/or the memory under test 124 when performing functional execution sequences 114 of FIG. 1. Similarly, the state of all latches in the self-test chains 322 can be unloaded serially through chain select 304 as STUMP channel scan output 310 into the MISR 305 forming a signature 325 representing compressed data results.

Each LBIST test cycle, in addition to the loading and unloading of the self-test chains 322, uses timed application of system clocks to launch a test vector through self-test chains 322 and capture a resulting response in receiving latches. Test timing can be controlled by phase locked loop 307 and an OPCG function 317 to produce scan clocks 306 for structural and functional exercising of the functional logic 301 and MISR clocks 316.

One or more recirculating mode enable latches 303 (i.e., a shared recirculation enable latch or multiple separate recirculation enable latches) can be used to determine whether each of the self-test chains 322 is operating as a scan chain or in a recirculating mode through recirculation selectors 315. The separate latches 303 allow for separate selection and timing of transitions between passing a test input source 320 or a recirculating feedback 309 from output 319 of the self-test chains 322 through the recirculation selectors 315 as input to the self-test chains 322. A ring recirculate control 308 can interface with the OPCG 317 for recirculating scan control channel selection 318 and to provide controls for the MISR 305 in recirculating operation. The OPCG 317 and/or the ring recirculate control 308 are examples of one or more functional test exercisers 330 that can support execution of the functional execution sequences 114 of FIG. 1. After a ring dump to the MISR 305, a functional test can be restarted to progressively isolate a failure source. Recirculation can support the ability to restart the functional execution sequences 114 of FIG. 1 at a checkpoint position rather than restarting at the beginning of an execution sequence to speed the process of progressively isolating one or more likely causes of a failure as a most likely failure source.

Figure 4:
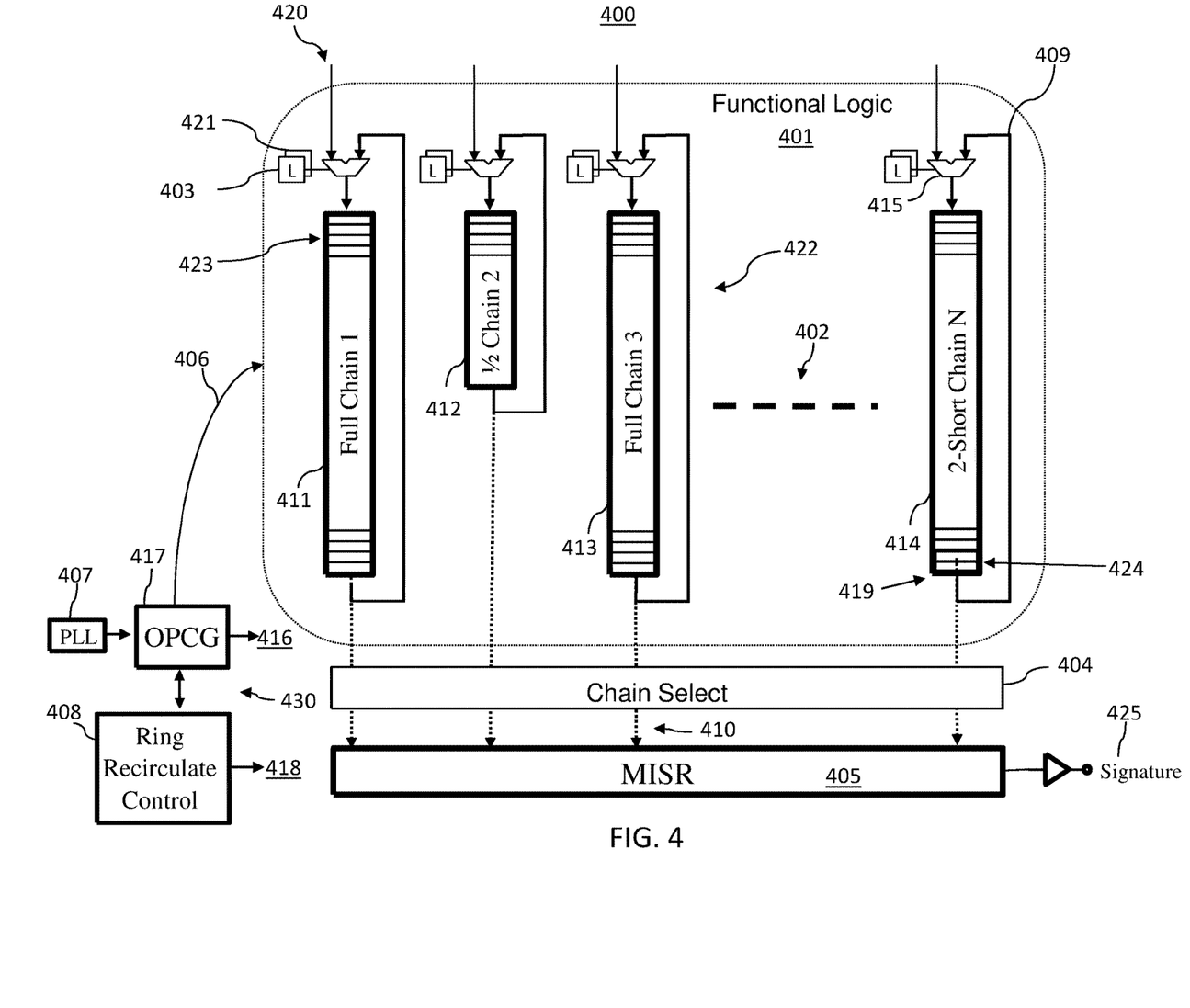
FIG. 4 illustrates a further example of a test support system in a device under test in accordance with an embodiment.

FIG. 4 illustrates a further example of a test support system 400 in a device under test in accordance with an embodiment, such as the test support system 120 of DUT 112 of FIG. 1. The test support system 400 includes functional logic 401 that controls the flow of test data through a plurality of built-in test support circuits 402 including self-test chains 422. The self-test chains 422 can include a plurality of STUMP/self-test chains 411, 412, 413, 414 of various lengths. The self-test chains 422 can be formed from storage elements, such as latches 423 or registers, of the logic under test 122 of FIG. 1. When in LBIST mode of operation, the storage elements can be concatenated in one or more self-test chains 422, which may be externally and individually accessible via one or more serial inputs and outputs. One or more of the self-test chains 422 can be loaded and unloaded serially for each LBIST test. Once in LBIST mode, one or more scan chains of storage elements can be reconfigured into a number of parallel sub-chains as the self-test chains 422 including chains 411, 412, 413, 414.

During functional testing, inputs (e.g., test input source 420 320 or functional stimuli clocked broadly into the latches via the latch system ports) to the self-test chains 422 are based on instruction sequencing and/or memory operations with respect to the logic under test 122 and/or the memory under test 124 when performing functional execution sequences 114 of FIG. 1. Similarly, the state of all latches in the self-test chains 422 can be unloaded serially through individual chain selects 404 as STUMP channel scan outputs 410 into the MISRs 405 forming a signature 425 representing the compressed data.

Each LBIST test cycle, in addition to the loading and unloading of the self-test chains 422, uses timed application of system clocks to launch a test vector through self-test chains 422 and capture a resulting response in receiving latches. Test timing can be controlled by phase locked loop 407 and an OPCG function 417 to produce scan clocks 406 for structural and functional exercising of the functional logic 401 and MISR clocks 416.

One or more recirculating mode enable latches 403 (i.e., a shared recirculation enable latch or multiple separate recirculation enable latches) and one or more scan clock disable latches 421 (i.e., a scan clock disable latch or multiple separate scan clock disable latches) can be used to determine whether each of the self-test chains 422 is operating as a scan chain or in a recirculating mode through recirculation selectors 415 and/or is disabled. The separate latches 403 allow for separate selection and timing of transitions between passing a test input source 420 or a recirculating feedback 409 from output 419 of the self-test chains 422 through the recirculation selectors 415 as input to the self-test chains 422. The scan clock disable latches 421 allow shifting of data through a selected self-test chain 422 to be paused while one or more other self-test chains 422 continue to actively shift data responsive to the scan clocks 406. A ring recirculate control 408 can interface with the OPCG 417 for recirculating scan control channel selection 418 and to provide controls for the MISR 405 in recirculating operation. The OPCG 417 and/or the ring recirculate control 408 are examples of one or more functional test exercisers 430 that can support execution of the functional execution sequences 114 of FIG. 1. After a ring dump to the MISR 405, a functional test can be restarted to progressively isolate a failure source. Recirculation can support the ability to restart the functional execution sequences 114 of FIG. 1 at a checkpoint position rather than restarting at the beginning of an execution sequence to speed the process of progressively isolating one or more likely causes of a failure as a most likely failure source.

With respect to the examples of FIGS. 1-4, the functional state of the DUT 112 can be verified based on STUMP chain configuration for LBIST. MISRs 205, 305, 405 can be used from LBIST STUMP channels to verify the functional state of the DUT 112. A functional run defined by the functional execution sequences 114 can be checkpointed by stopping the clocks and recirculating the rings (e.g., using recirculating feedback 209, 309, 409 through respective recirculation selectors 215, 315, 415). Chain/ring outputs 219, 319, 419 can be selectively passed to one or more of the MISRs 205, 305, 405 using chain select 204, 304, 404. In multiple instances of similar core design, core MISRs can be checked against each other internally, for example. Multiple checkpoint dumps can be accumulated in the MISRs 205, 305, 405. Functional clock start/stop/restart and dynamically modifiable checkpoints can be used to cycle through different functional execution sequence portions to iteratively invoke a portion of a functional execution sequence between a plurality of the checkpoints to progressively isolate the one or more likely causes of the failure as a most likely failure source in combination with one or more results from the one or more built-in test support circuits. The diagnostic process can be automated via a scripting sequence in the scripts 116 of FIG. 1.

Figure 5:
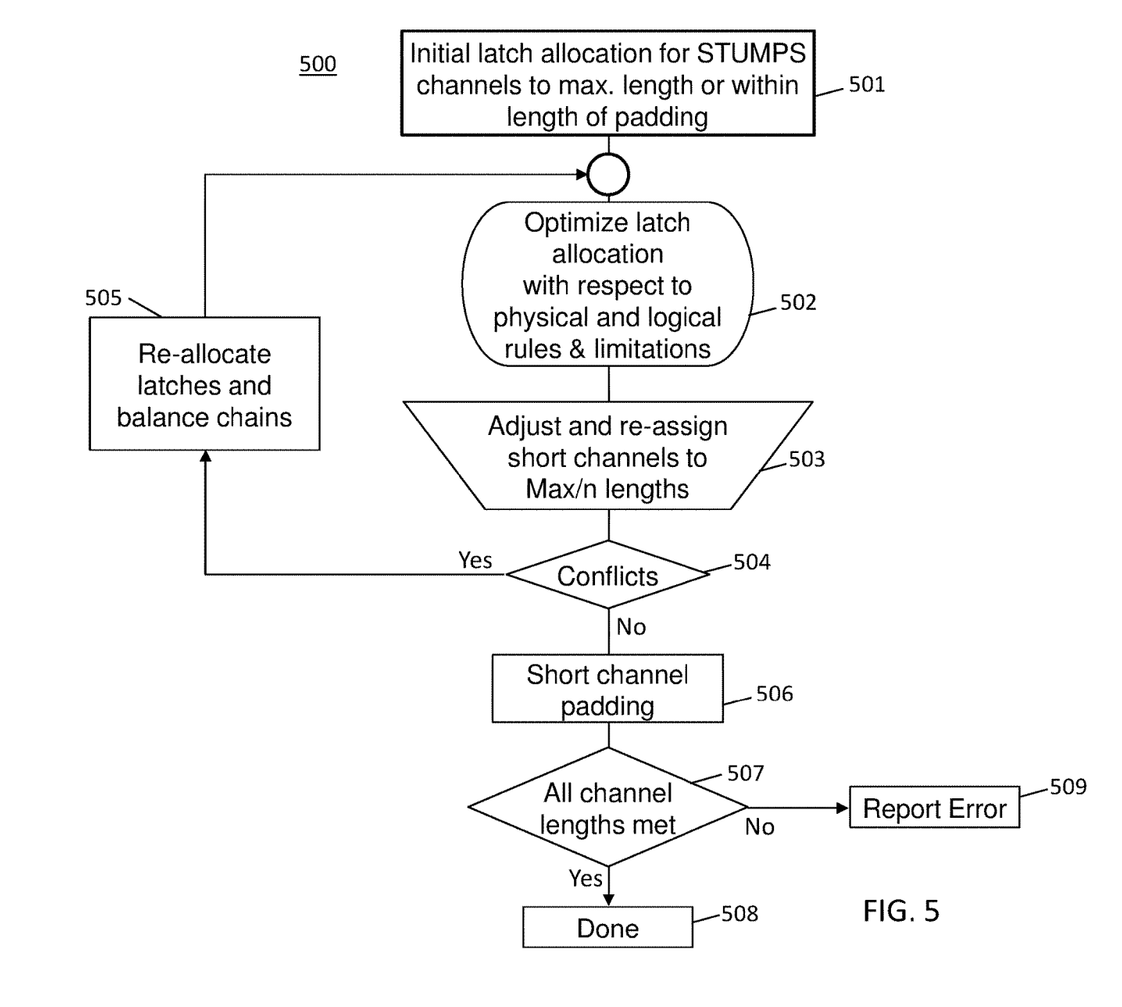
FIG. 5 illustrates an example of a process flow for providing non-destructive recirculation test support in a device under test in accordance with an embodiment.

FIG. 5 illustrates an example of a process flow 500 for providing non-destructive recirculation test support in a device under test in accordance with an embodiment and with reference to FIGS. 1-4. For purposes of explanation, process flow 500 is described primarily with respect to FIGS. 1 and 2.

At block 501, latch allocator 107 can make an initial latch allocation for STUMPS channels to a maximum length or within a length of padding. For example, if the grouping constraints 109 define the maximum length of the self-test chains 222 to include 1024 latches 223, the latch allocator 107 can access the DUT layout definition 110 and assign particular latches 223 to particular self-test chains 222, such as full chains 211, 213, half chain 212, and/or 2-short chain 214. At block 502, an optimized allocation of the latches 223 can be determined by latch allocator 107 with respect to physical and logical rules and limitations as defined in the grouping constraints 109. For example, latches 223 that are part of the same functional unit in the logic under test 122 or are close physical proximity as defined in the DUT layout definition 110 can be grouped in the same self-test chains 222. At block 503, latch allocator 107 can adjust and re-assign short channels to maximum length or binary divisible integer length channels. For example, if the maximum length is 1024, a 520-length chain and a 480-length chain may both be merged into the same 1024-length chain if the chains meet other grouping constraints (e.g., sufficiently close physical proximity). Similarly, since 512 is a binary divisible integer length of 1024 (i.e., 1024/2=512), a 480-length chain may be merged with a 30-length chain into a 512-length chain, for example. In embodiments, the latch allocator 107 can adjust the lengths of all the chains such that the initial value of all the latches is restored after complete recirculation is performed on all the chains simultaneously.

At block 504, a conflict check is performed to ensure that any assignments and adjustments do not conflict. If there is a conflict detected at block 504, then a further reallocation of latches 223 and chain balancing is performed at block 505 and flow returns to block 502. If no conflicts are detected at block 504, short channel padding is performed at block 506 to add latches to channels that are not sized at the maximum length or binary divisible integer length (e.g., add two latches of latch padding 224 for a chain length of 1022, 510, 254, 126, 62, 30, etc.). At block 507, if all chain length constraints are met, then the process is done at block 508; otherwise, an error can be reported at block 509. A final definition can be captured in DUT layout definition 110 used to fabricate or have fabricated portions of the DUT 112 or to adjust configuration parameters of the test support system 120 where dynamic latch assignment is supported.

Figure 6:
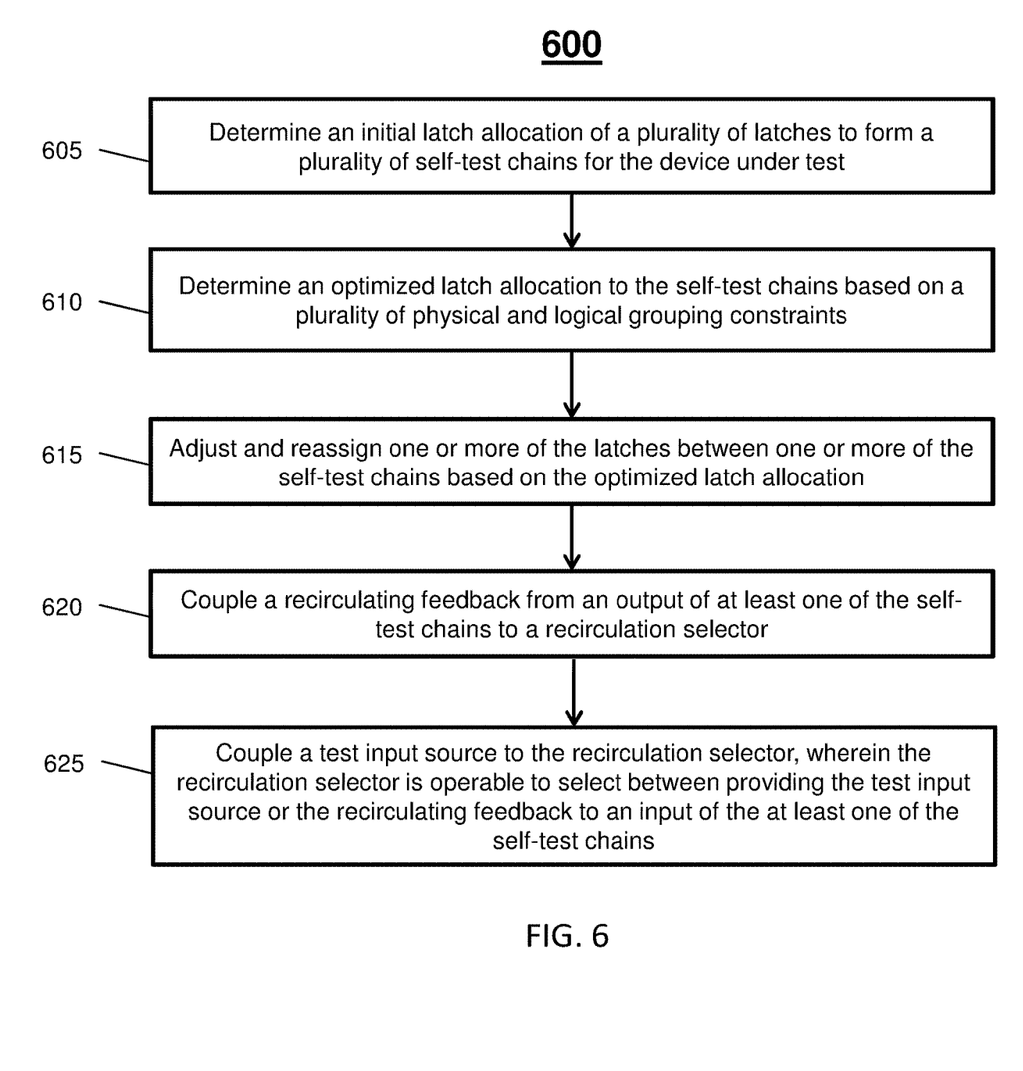
FIG. 6 illustrates another process flow for providing non-destructive recirculation test support in a device under test in accordance with an embodiment.

Turning now to FIG. 6, a flow diagram of a process 600 for providing non-destructive recirculation test support in a device under test is generally shown in accordance with an embodiment. The process 600 is described with reference to FIGS. 1-5 and may include additional steps beyond those depicted in FIG. 6.

At block 605, an initial latch allocation of a plurality of latches is determined to form a plurality of self-test chains for the device under test. For example, latch allocator 107 can assign particular latches 323 to specific instances of the self-test chains 322 as defined in the DUT layout definition 110.

At block 610, an optimized latch allocation to the self-test chains is determined based on a plurality of physical and logical grouping constraints. For instance, the latch allocator 107 can apply the grouping constraints 109 to adjust the initial allocation of latches 323 to self-test chains 322.

At block 615, one or more of the latches can be adjusted and reassigned between one or more of the self-test chains based on the optimized latch allocation. For example, one or more of the latches 323 can be moved between self-test chains 311-314. Channel padding can be added, including one or more additional latches to extend one or more of the self-test chains to a binary divisible integer length, such as latch padding 324.

At block 620, a recirculating feedback is coupled from an output of at least one of the self-test chains to a recirculation selector. For example, instances of recirculating feedback 324 are coupled to corresponding recirculation selectors 315 for each of the self-test chains 322.

At block 625, a test input source is coupled to the recirculation selector. Thus, each recirculation selector 315 can select between a test input source 320 and a circulating feedback 324 as an input to each of the self-test chains 322 based on the state of the recirculating mode enable latches 303.

A plurality of results from the output 319 of the at least one of the self-test chains 322 can be stored to one or more signature registers (e.g., MISR 305) based on selecting the test input source 320 at the recirculation selector 315. The plurality of results can be blocked from being stored in the one or more signature registers based on selecting the recirculating feedback 309 at the recirculation selector 315.

Two or more of the self-test chains 222, 322, 422 can have separate instances of the recirculation selector 215, 315, 415. The separate instances of the recirculation selector 215 can be controlled by a shared recirculation enable signal 203. Alternatively, the separate instances of the recirculation selector 315, 415 can be independently controlled to select the test input source 320, 420 for one or more of the self-test chains 322, 422 in combination with selecting the recirculating feedback 309, 409 for at least one of the self-test chains 322, 422. At least two of the self-test chains 422 can have separately controlled scan clocks 406, which may be selectively enabled/disabled responsive to scan clock disable latches 421.

Figure 7:
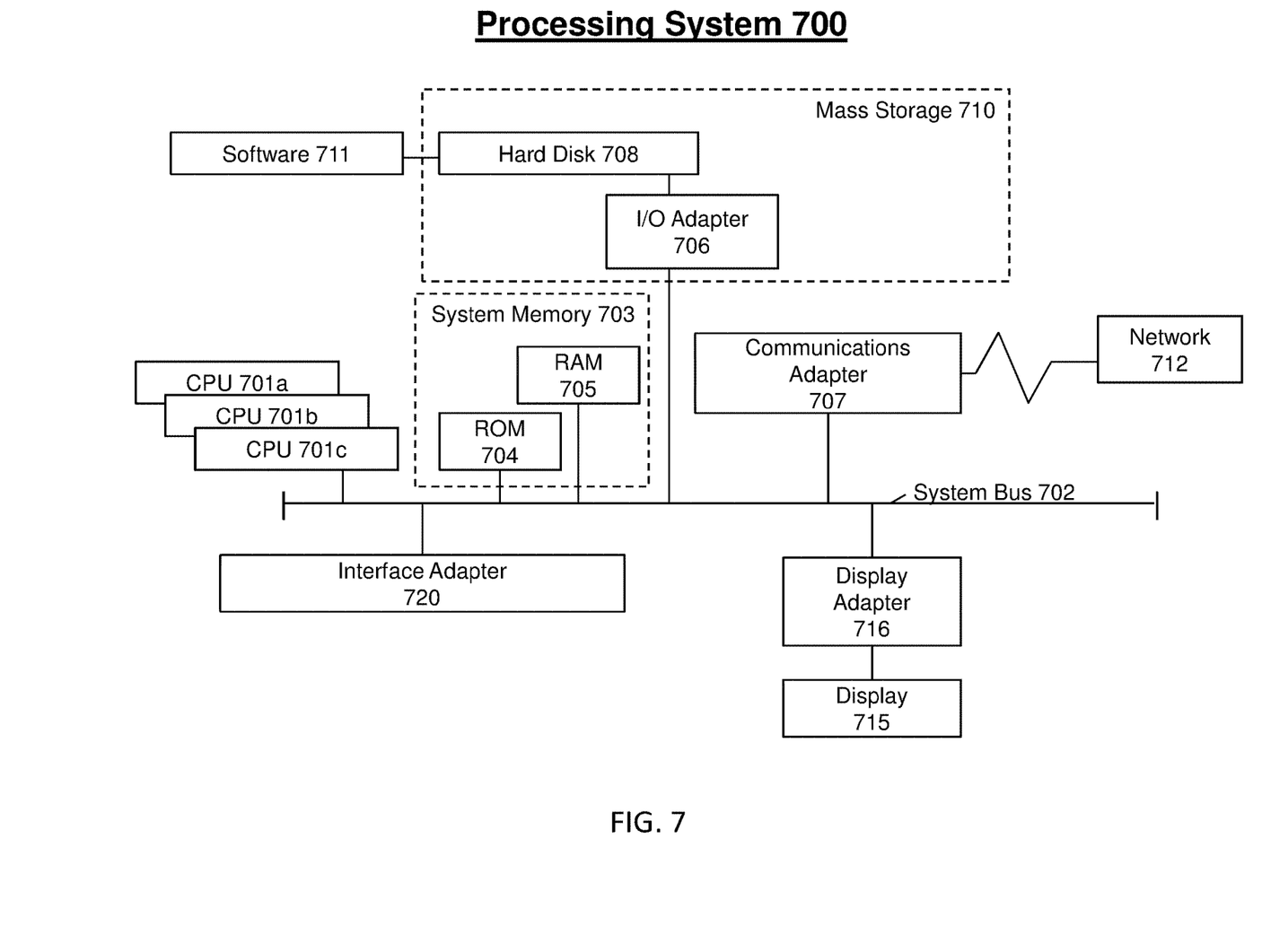
FIG. 7 illustrates a processing system in accordance with an embodiment.

Referring now to FIG. 7, there is shown an embodiment of a processing system 700 for implementing the teachings herein. In this embodiment, the processing system 700 has one or more central processing units (processors) 701a, 701b, 701c, etc. (collectively or generically referred to as processor(s) 701) that can be an embodiment of the processor 104 of FIG. 1. The processors 701, also referred to as processing circuits, are coupled via a system bus 702 to a system memory 703 and various other components (such as one or more DUT 112 of FIG. 1). The system memory 703 can include read only memory (ROM) 704 and random access memory (RAM) 705. The ROM 704 is coupled to system bus 702 and may include a basic input/output system (BIOS), which controls certain basic functions of the processing system 700. RAM 705 is read-write memory coupled to system bus 702 for use by the processors 701.

FIG. 7 further depicts an input/output (I/O) adapter 706 and a communications adapter 707 coupled to the system bus 702. I/O adapter 706 may be a small computer system interface (SCSI) adapter that communicates with a hard disk 708 and/or any other similar component. I/O adapter 706 and hard disk 708 are collectively referred to herein as mass storage 710. Software 711 for execution on the processing system 700 may be stored in mass storage 710. The mass storage 710 is an example of a tangible storage medium readable by the processors 701, where the software 711 is stored as instructions for execution by the processors 701 to perform a method, such as the process flows 500, 600 of FIGS. 5 and 6. Communications adapter 707 interconnects the system bus 702 with an outside network 712 enabling processing system 700 to communicate with other such systems. A display 715 is connected to system bus 702 via a display adapter 716, which may include a graphics controller to improve the performance of graphics intensive applications and a video controller. In one embodiment, adapters 706, 707, and 716 may be connected to one or more I/O buses that are connected to the system bus 702 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices can be connected to the system bus 702 via an interface adapter 720 and the display adapter 716. A keyboard, mouse, speaker can be interconnected to the system bus 702 via the interface adapter 720, which may include, for example, a Super I/O chip integrating multiple device adapters into a single integrated circuit.

Thus, as configured in FIG. 7, the processing system 700 includes processing capability in the form of processors 701, and, storage capability including the system memory 703 and the mass storage 710, input means such as keyboard and mouse, and output capability including speaker and the display 715. In one embodiment, a portion of the system memory 703 and the mass storage 710 collectively store an operating system, such as the z/OS or AIX operating system from IBM Corporation, to coordinate the functions of the various components shown in FIG. 7.

Technical effects and benefits include increased efficiency testing and fault cause isolation for a device under test. Embodiments support detection of intermittent fails while using at-speed functional test and diagnostics. Embodiment use built-in test support features for diagnostics at production and/or after deployment in the field. Embodiments can modify a device under test layout to optimize assignment of latches to chains with recirculation capability and align scan timing between chains. Sizing chains to binary divisible integer lengths enables scaled recirculation timing between chains, e.g., a 256-length chain can be recirculated four times in parallel with a single scan through of a 1024-length chain.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of providing non-destructive recirculation test support in a device under test, the method comprising:
   determining an initial latch allocation of a plurality of latches to form a plurality of self-test chains in parallel for the device under test, wherein the initial latch allocation comprises at least two of the self-test chains having a different number of the latches and limited to a maximum length per self-test chain;
   determining an optimized latch allocation to the self-test chains based on a plurality of physical and logical grouping constraints;
   adjusting and reassigning one or more of the latches between one or more of the self-test chains based on the optimized latch allocation, the reassigning comprising combining two or more of the self-test chains into a single self-test chain;
   adding channel padding comprising one or more additional latches to extend one or more of the self-test chains to a binary divisible integer length;
   coupling a recirculating feedback from an output of at least one of the self-test chains to a recirculation selector; and
   coupling a test input source to the recirculation selector, wherein the recirculation selector is operable to select between providing the test input source or the recirculating feedback to an input of the at least one of the self-test chains.

2. The method of claim 1, further comprising:
   storing a plurality of results from the output of the at least one of the self-test chains to one or more signature registers based on selecting the test input source at the recirculation selector; and
   blocking the plurality of results from being stored in the one or more signature registers based on selecting the recirculating feedback at the recirculation selector.

3. The method of claim 1, wherein two or more of the self-test chains have separate instances of the recirculation selector.

4. The method of claim 3, wherein the separate instances of the recirculation selector are controlled by a shared recirculation enable signal.

5. The method of claim 3, wherein the separate instances of the recirculation selector are independently controlled to select the test input source for one or more of the self-test chains in combination with selecting the recirculating feedback for at least one of the self-test chains.

6. The method of claim 3, wherein at least two of the self-test chains have separately controlled scan clocks.

7. The method of claim 1, further comprising:
   configuring the non-destructive recirculation test support in the device under test to perform a functional test diagnostic process.

8. The method of claim 1, further comprising:
   configuring the non-destructive recirculation test support in the device under test to use the self-test chains in a logic built-in self-test mode of operation; and
   performing one or more signature analysis diagnostics processes in the logic built-in self-test mode.

9. A system comprising:
   a device under test comprising:
      a plurality of latches; and
      one or more built-in test support circuits; and
   a test and development system comprising a processor operable to perform:
      determining an initial latch allocation of the plurality of latches to form a plurality of self-test chains in parallel for the device under test, wherein the initial latch allocation comprises at least two of the self-test chains having a different number of the latches and limited to a maximum length per self-test chain;
      determining an optimized latch allocation to the self-test chains based on a plurality of physical and logical grouping constraints;
      adjusting and reassigning one or more of the latches between one or more of the self-test chains based on the optimized latch allocation, the reassigning comprising combining two or more of the self-test chains into a single self-test chain;

adding channel padding comprising one or more additional latches to extend one or more of the self-test chains to a binary divisible integer length;

coupling a recirculating feedback from an output of at least one of the self-test chains to a recirculation selector of the one or more built-in test support circuits; and coupling a test input source to the recirculation selector, wherein the recirculation selector is operable to select between providing the test input source or the recirculating feedback to an input of the at least one of the self-test chains.

10. The system of claim 9, wherein the test and development system is operable to perform:

storing a plurality of results from the output of the at least one of the self-test chains to one or more signature registers based on selecting the test input source at the recirculation selector; and blocking the plurality of results from being stored in the one or more signature registers based on selecting the recirculating feedback at the recirculation selector.

11. The system of claim 9, wherein two or more of the self-test chains have separate instances of the recirculation selector.

12. The system of claim 11, the separate instances of the recirculation selector are controlled by a shared recirculation enable signal.

13. The system of claim 11, wherein the separate instances of the recirculation selector are independently controlled to select the test input source for one or more of the self-test chains in combination with selecting the recirculating feedback for at least one of the self-test chains.

14. The system of claim 11, wherein at least two of the self-test chains have separately controlled scan clocks.

15. A computer program product for providing non-destructive recirculation test support in a device under test, the computer program product comprising a computer readable storage medium having program instructions embodied therewith, wherein the computer readable storage medium is not a transitory signal per se, the program instructions executable by a processor to cause the processor to perform a method comprising:

determining an initial latch allocation of a plurality of latches to form a plurality of self-test chains in parallel for the device under test, wherein the initial latch allocation comprises at least two of the self-test chains having a different number of the latches and limited to a maximum length per self-test chain;

determining an optimized latch allocation to the self-test chains based on a plurality of physical and logical grouping constraints;

adjusting and reassigning one or more of the latches between one or more of the self-test chains based on the optimized latch allocation, the reassigning comprising combining two or more of the self-test chains into a single self-test chain;

adding channel padding comprising one or more additional latches to extend one or more of the self-test chains to a binary divisible integer length;

coupling a recirculating feedback from an output of at least one of the self-test chains to a recirculation selector; and coupling a test input source to the recirculation selector, wherein the recirculation selector is operable to select between providing the test input source or the recirculating feedback to an input of the at least one of the self-test chains.

16. The computer program product of claim 15, wherein the program instructions further cause the processor to perform:

storing a plurality of results from the output of the at least one of the self-test chains to one or more signature registers based on selecting the test input source at the recirculation selector; and blocking the plurality of results from being stored in the one or more signature registers based on selecting the recirculating feedback at the recirculation selector.

17. The computer program product of claim 15, wherein two or more of the self-test chains have separate instances of the recirculation selector, and the separate instances of the recirculation selector are controlled by a shared recirculation enable signal.

18. The computer program product of claim 15, wherein two or more of the self-test chains have separate instances of the recirculation selector, and the separate instances of the recirculation selector are independently controlled to select the test input source for one or more of the self-test chains in combination with selecting the recirculating feedback for at least one of the self-test chains.

* * * * *